(12) United States Patent
Majumder (10) Patent No.: US 8,324,948 B1
(45) Date of Patent: Dec. 4, 2012

(54) METHOD AND APPARATUS FOR DUTY-CYCLE CORRECTION WITH REDUCED CURRENT CONSUMPTION

(75) Inventor: Amit Majumder, Duluth, GA (US)

(73) Assignee: Integrated Device Technology, Inc., San Jose, CA (US)

( * ) Notice: Subject to any disclaimer, the term of this patent is extended or adjusted under 35 U.S.C. 154(b) by 69 days.

(21) Appl. No.: 12/889,254

(22) Filed: Sep. 23, 2010

(51) Int. Cl.
*H03K 5/04* (2006.01)
(52) U.S. Cl. .......................... 327/175; 327/172
(58) Field of Classification Search .................. None
See application file for complete search history.

(56) References Cited

U.S. PATENT DOCUMENTS

| | | | | |
|---|---|---|---|---|
| 5,945,857 A * | 8/1999 | Havens | | 327/175 |
| 6,721,232 B2 * | 4/2004 | Kashiwazaki | | 365/189.15 |
| 7,282,978 B2 * | 10/2007 | Lee | | 327/175 |
| 7,317,341 B2 * | 1/2008 | Cho | | 327/175 |
| 2007/0159224 A1 * | 7/2007 | Dwarka et al. | | 327/175 |

* cited by examiner

*Primary Examiner* — Cassandra Cox
(74) *Attorney, Agent, or Firm* — Heimlich Law, PC; Alan Heimlich, Esq.

(57) ABSTRACT

A method and apparatus for duty-cycle correction with reduced current consumption have been described.

14 Claims, 10 Drawing Sheets

1. A method for duty cycle correction comprising:
   receiving an output signal;
   phase splitting said output signal producing phase split signals;
   applying said phase split signals to a resistor-capacitor network; and
   using two outputs from said resistor-capacitor network to duty cycle correct said output signal.
   1001

2. The method of claim 1 wherein said resistor-capacitor network further comprises a first transmission gate and a second transmission gate.
   1002

3. The method of claim 2 wherein said first transmission gate has an input coupled to said resistor-capacitor network and an output coupled to a correction circuit input.
   1003

4. The method of claim 3 wherein said second transmission gate has an input coupled to reference voltage and an output coupled to said correction circuit input.
   1004

5. The method of claim 4 wherein said second transmission gate when activated sets said correction circuit input to said reference voltage.
   1005

6. The method of claim 5 further comprising a switch which when activated sets said two outputs from said resistor-capacitor network to a same voltage.
   1006

7. An apparatus comprising:
   a duty cycle correction circuit having an output, a first duty cycle correction input, and a second duty cycle correction input;
   a phase splitter having an input, a first output, and a second output, said phase splitter input coupled to said duty cycle correction circuit output;
   a first resistor-capacitor network having an input and an output, said first resistor-capacitor network input coupled to said phase splitter first output; and
   a second resistor-capacitor network having an input and an output, said second resistor-capacitor network input coupled to said phase splitter second output.
   1007

8. The apparatus of claim 7 further comprising:
   a first transmission gate having an input and an output, said first transmission gate input coupled to said first resistor-capacitor network output; and
   a second transmission gate having an input and an output, said second transmission gate input coupled to said second resistor-capacitor network output.
   1008

9. The apparatus of claim 8 further comprising:
   a switch between said first transmission gate output and said second transmission gate output.
   1009

10. The apparatus of claim 9 further comprising:
    wherein said first transmission gate output is coupled to said first duty cycle correction input.
    1010

11. The apparatus of claim 10 further comprising:
    wherein said second transmission gate output is coupled to said second duty cycle correction input.
    1011

12. The apparatus of claim 11 further comprising:
    a third transmission gate having an input and an output, said third transmission gate output coupled to said first transmission gate output; and
    a fourth transmission gate having an input and an output, said fourth transmission gate output coupled to said second transmission gate output.
    1012

13. The apparatus of claim 12 further comprising:
    wherein said third transmission gate input and said fourth transmission gate input are coupled to a reference voltage.
    1013

14. A method comprising:
    phase splitting a signal to be duty cycle corrected thereby producing a plurality of outputs;
    averaging each of said plurality of outputs; and
    using said averaged each plurality of outputs to duty cycle correct said signal.
    1014

15. The method of claim 14 further comprising:
    setting said plurality of outputs to a reference voltage before beginning said averaging said plurality of outputs.
    1015

FIG. 10

METHOD AND APPARATUS FOR DUTY-CYCLE CORRECTION WITH REDUCED CURRENT CONSUMPTION

FIELD OF THE INVENTION

The present invention pertains to duty-cycle (also denoted duty cycle) correction. More particularly, the present invention relates to a method and apparatus for duty-cycle correction with reduced current consumption.

BACKGROUND OF THE INVENTION

Digital circuits often produce duty cycles that are not what are needed by circuits that follow. For example, a circuit may work optimally (best performance, fastest speed, lowest power, etc.) when fed a signal having a duty cycle of 50:50 (e.g. 50% low, 50% high). If a signal has a duty cycle that is not optimal then a duty-cycle correction (DCC) circuit may be employed to correct the duty-cycle. Power consumption leads to heating and reduced reliability of a product. This presents a problem. Thus there is a great need for this technical problem to be solved by correcting the duty-cycle at reduced current consumption.

BRIEF DESCRIPTION OF THE DRAWINGS

The invention is illustrated by way of example and not limitation in the figures of the accompanying drawings in which.

DETAILED DESCRIPTION

In one embodiment of the invention current consumption in the DCC feedback block is greatly reduced over existing solutions.

Figure 3:
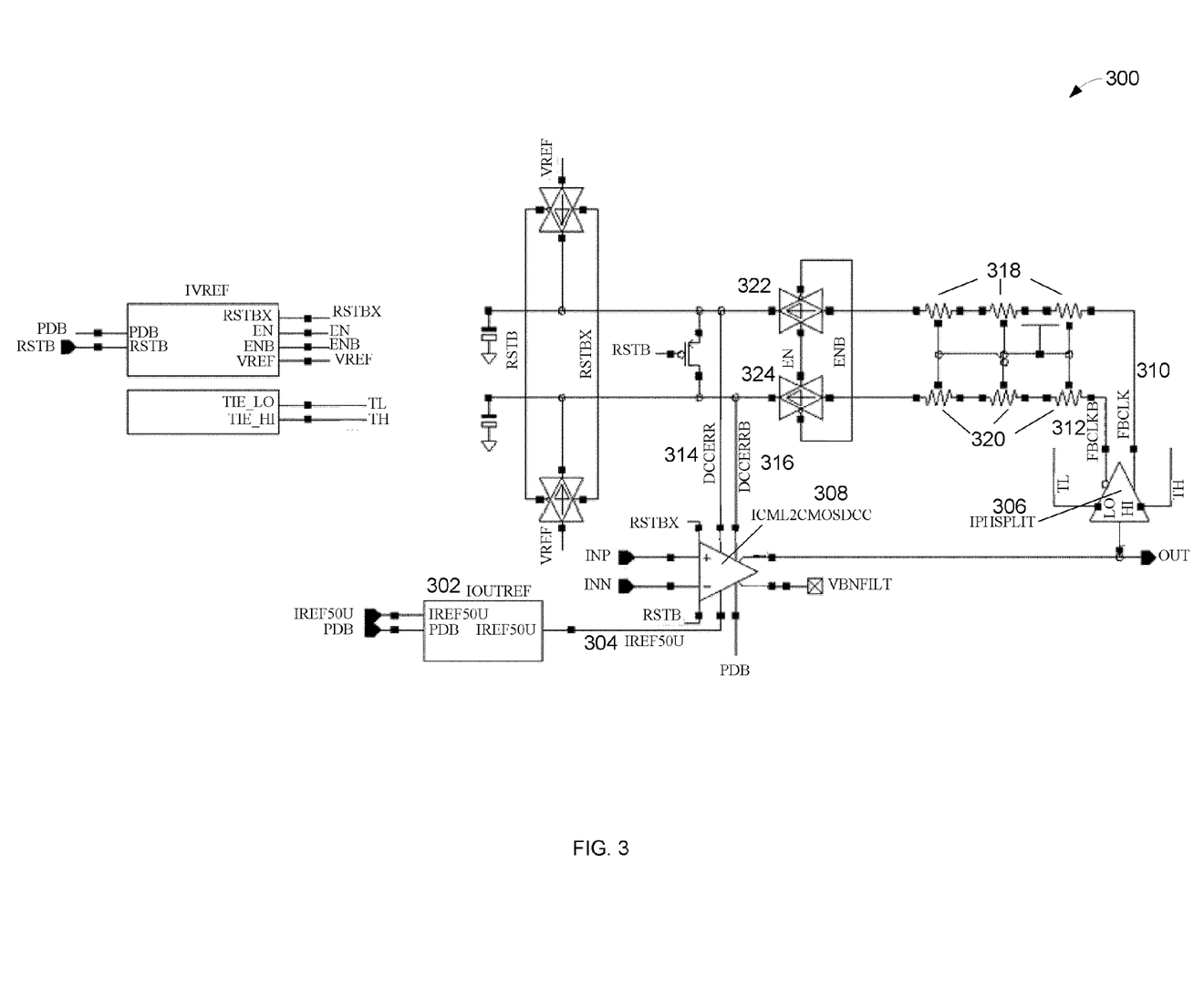
FIG. 3 illustrates one embodiment of the invention showing a schematic.

In one embodiment of the invention DCC loading on duty error signals (e.g. DCERR/DCERRB 314/316 as illustrated in FIG. 3) is vastly reduced over existing solutions.

Figure 6:
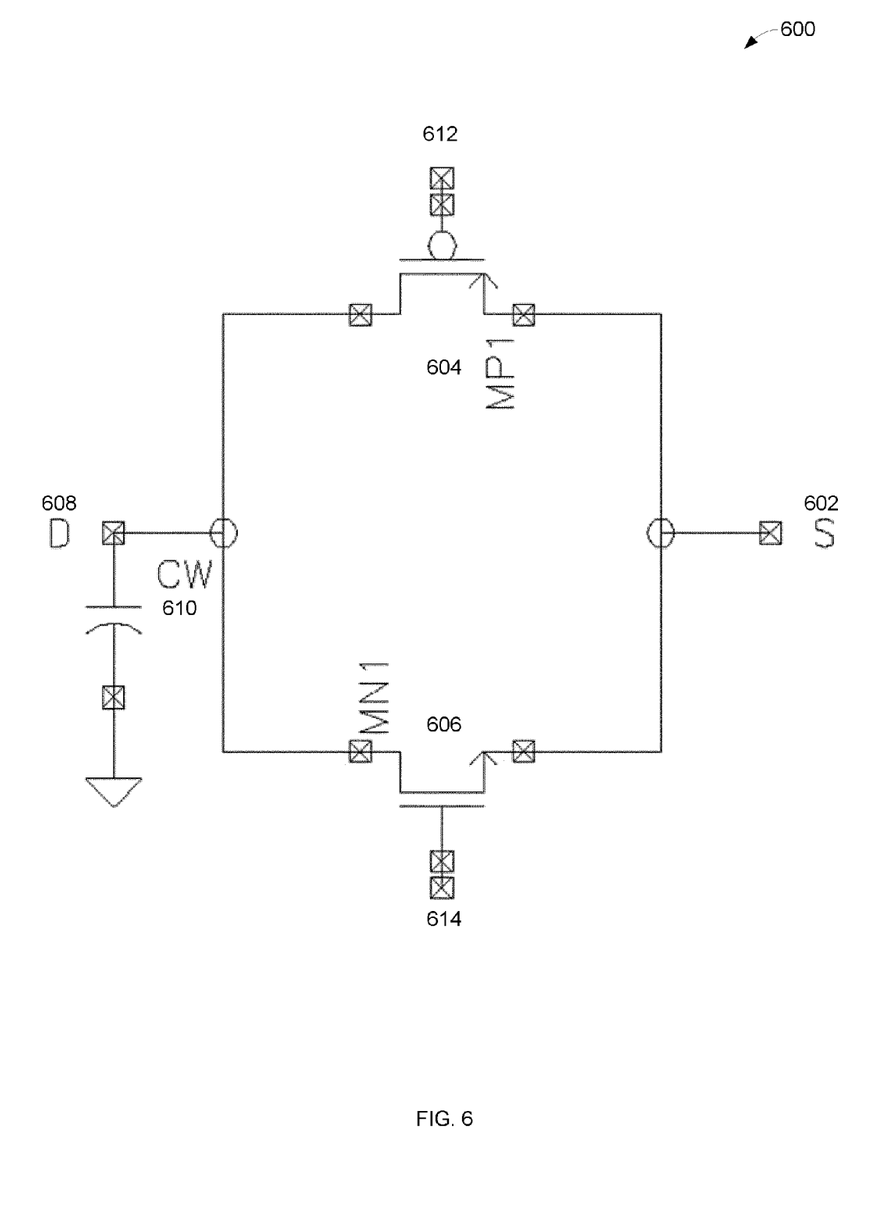
FIG. 6 illustrates an analog pass gate as used in embodiments of the invention.

FIG. 3 illustrates, generally at 300, one embodiment of the invention showing a schematic. The instance IOUTREF 302 produces a bias voltage at 304 IREF50U. Instance IPHSPLIT 306 is a phase splitter. Instance ICML2CMOSDCC 308 is a CML-to-CMOS converter DCC. The outputs FBCLK 310 and FBCLKB 312 of the IPHSPLIT 306 are passed through RC time constants—averaging the signals FBCLK 310 and FBCLKB 312 and thereby generating duty-cycle error signals DCCERR 314 and DCCERRB 316 which go into ICML2CMOSDCC 308. The RC time constants has as components resistors at 318 and 320 and their associated capacitance, and transmission gates 322 and 324 and their associated resistance and capacitance. For example, in FIG. 6 is shown in more detail a transmission gate. Also associated with the RC time constants are any parasitic capacitance and resistance due to component placement and/or routing and connections to other circuits.

Figure 4:
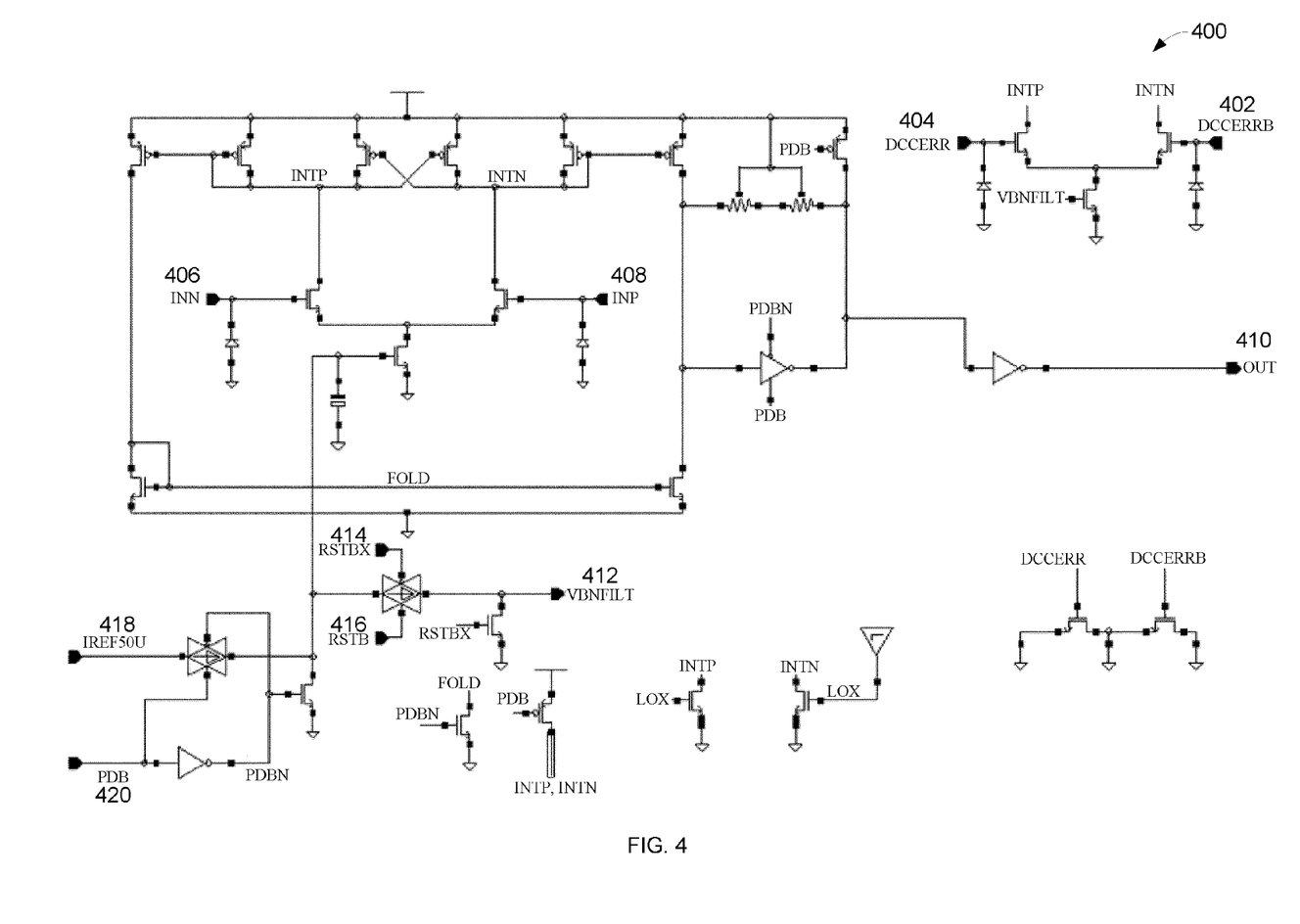
FIG. 4 illustrates one embodiment of the invention showing a schematic for a CML to CMOS converter.

FIG. 4 illustrates, generally at 400, one embodiment of the invention showing a schematic for a CML to CMOS converter such as shown in FIG. 3 at instance ICML2CMOSDCC 308. At 402 is input DCCERRB. At 404 is input DCCERR. At 406 is input INN. At 408 is input INP. At 410 is output OUT. At 412 is output VBNFILT. At 414 is input RSTBX. At 416 is input RSTB. At 418 is input IREF50U. At 420 is input PDB.

Figure 5:
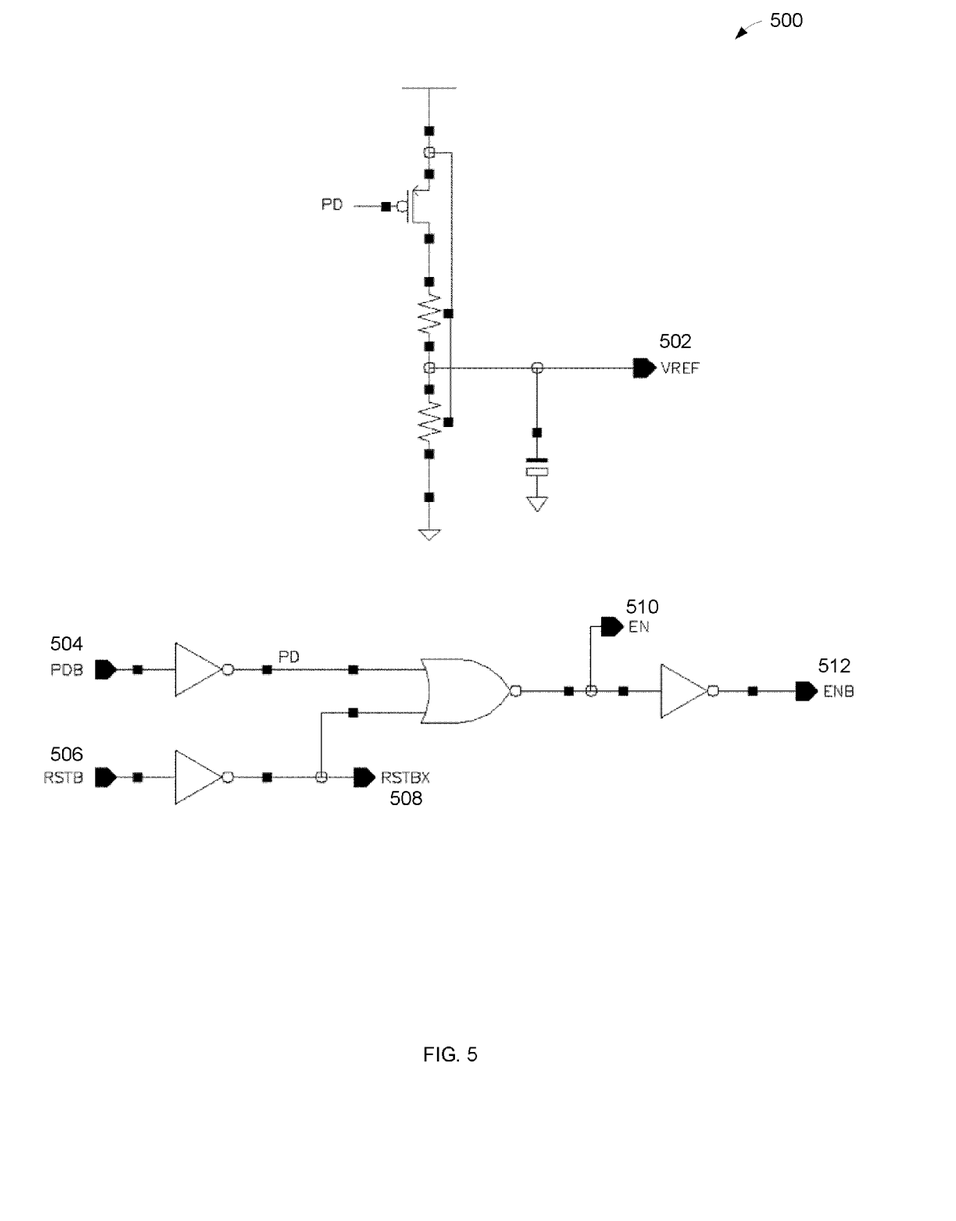
FIG. 5 illustrates one embodiment of the invention showing a schematic for a reference.

FIG. 5 illustrates, generally at 500, one embodiment of the invention showing a schematic for a reference such as shown at instance IVREF in FIG. 3. A power supply (denoted VDD) VDD/2 voltage generator outputs VREF at 502. At 504 is input PDB. At 506 is input RSTB. At 508 is output RSTBX. At 510 is output EN and at 512 is output ENB.

In one embodiment of the invention, such as shown in FIG. 5, showing an instance IVREF, IVREF consumes less than 20 µA DC current at VDD=1V.

FIG. 6 illustrates, generally at 600, an analog pass gate as used in embodiments of the invention (e.g. FIG. 3, etc.). At 602 is S a source for transistor MP1 604 and transistor MN1 606. At 608 is D a drain for transistor MP1 604 and transistor MN1 606. At 610 is CW a capacitance. At 612 and 614 are the control for transistor MP1 604 and transistor MN1 606 respectively.

Figure 7:
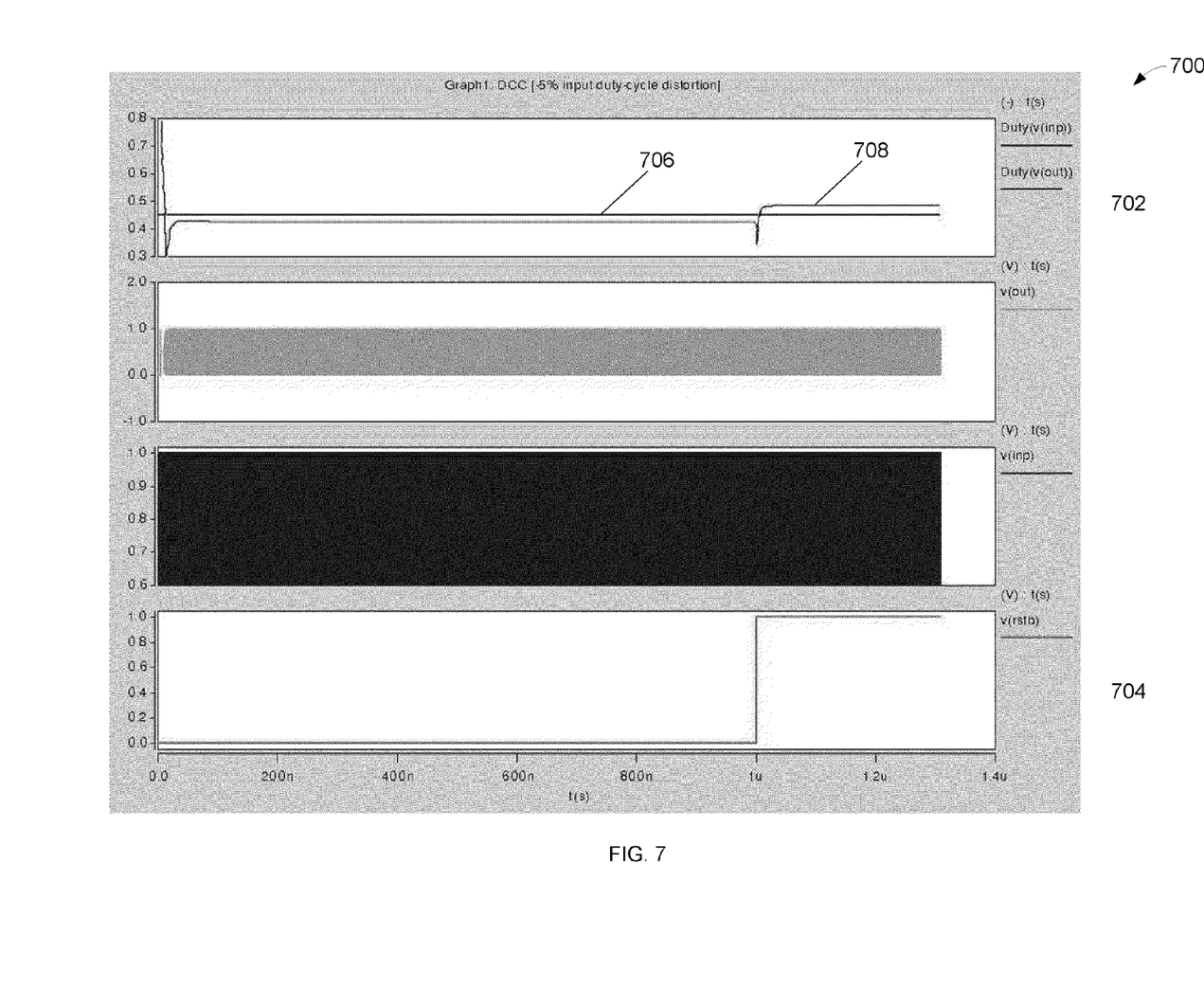
FIG. 7 illustrates one embodiment of the invention showing a duty cycle correction for −5% input duty cycle distortion.

FIG. 7 illustrates, generally at 700, one embodiment of the invention showing a duty cycle correction for −5% input duty cycle distortion (at 706). In graph 702 are shown an input duty voltage 706 and an output duty voltage 708. In graph 704 is a time scale for a control signal (e.g. RSTB as shown in the Figures). Prior to 1 µs shown on graph 704, when the control signal (e.g. RSTB as shown in the Figures) is low the output voltage for correction 708 is below the 706 line. After 1 µs, when the control signal (e.g. RSTB as shown in the Figures) is active high, then the output voltage for correction 708 is above the 706 line indicating a correction toward a duty cycle of 50%.

Figure 8:
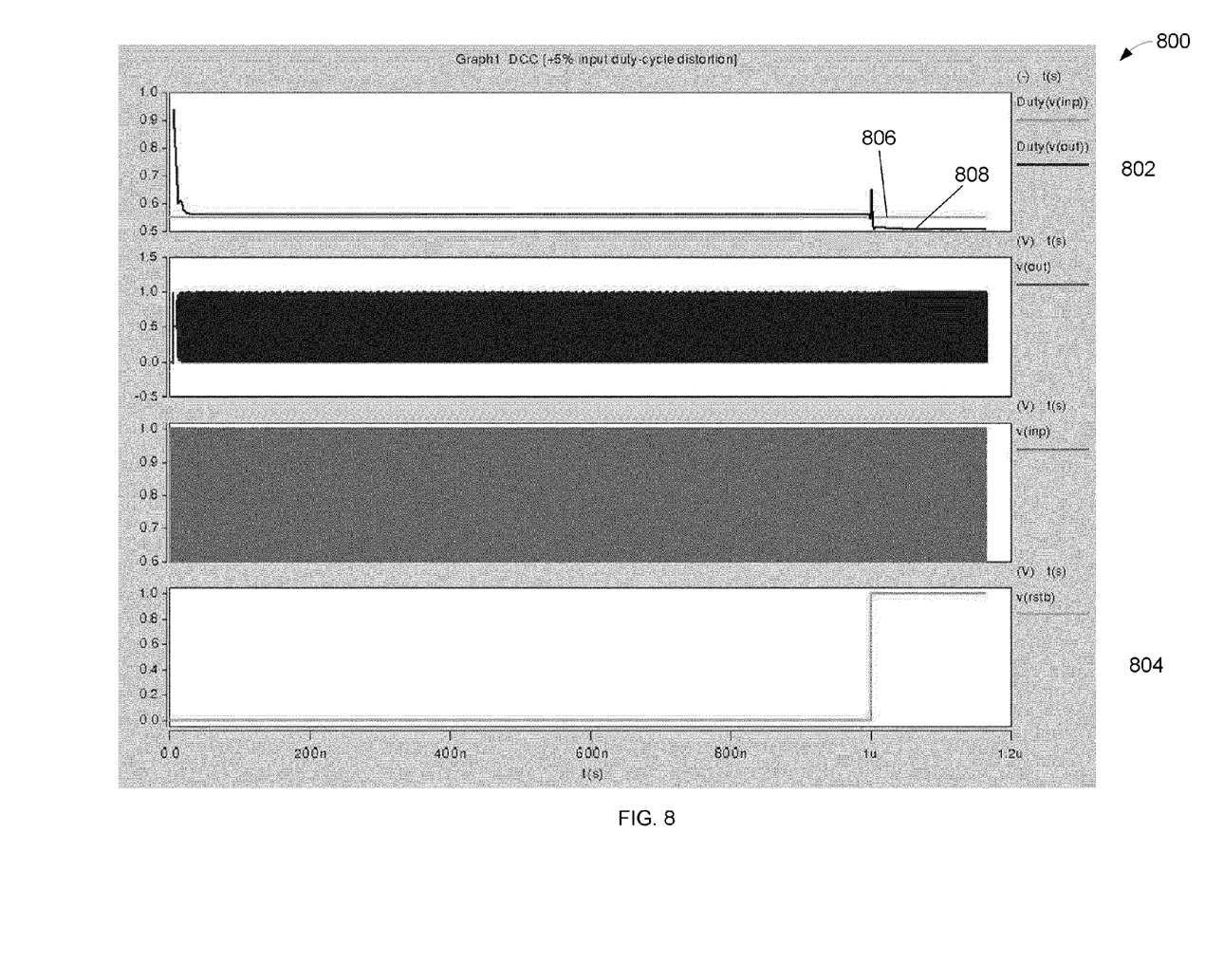
FIG. 8 illustrates, generally at 800, one embodiment of the invention showing a duty cycle correction for +5% input duty cycle distortion.

FIG. 8 illustrates, generally at 800, one embodiment of the invention showing a duty cycle correction for +5% input duty cycle distortion (at 806). In graph 802 are shown an input duty voltage 806 and an output duty voltage 808. In graph 804 is a time scale for a control signal (e.g. RSTB as shown in the Figures). Prior to 1 µs shown on graph 804, when the control signal (e.g. RSTB as shown in the Figures) is low the output voltage for correction 808 is above the 806 line. After 1 µs, when the control signal (e.g. RSTB as shown in the Figures) is active high, then the output voltage for correction 808 is below the 806 line indicating a correction toward a duty cycle of 50%.

Figure 9:
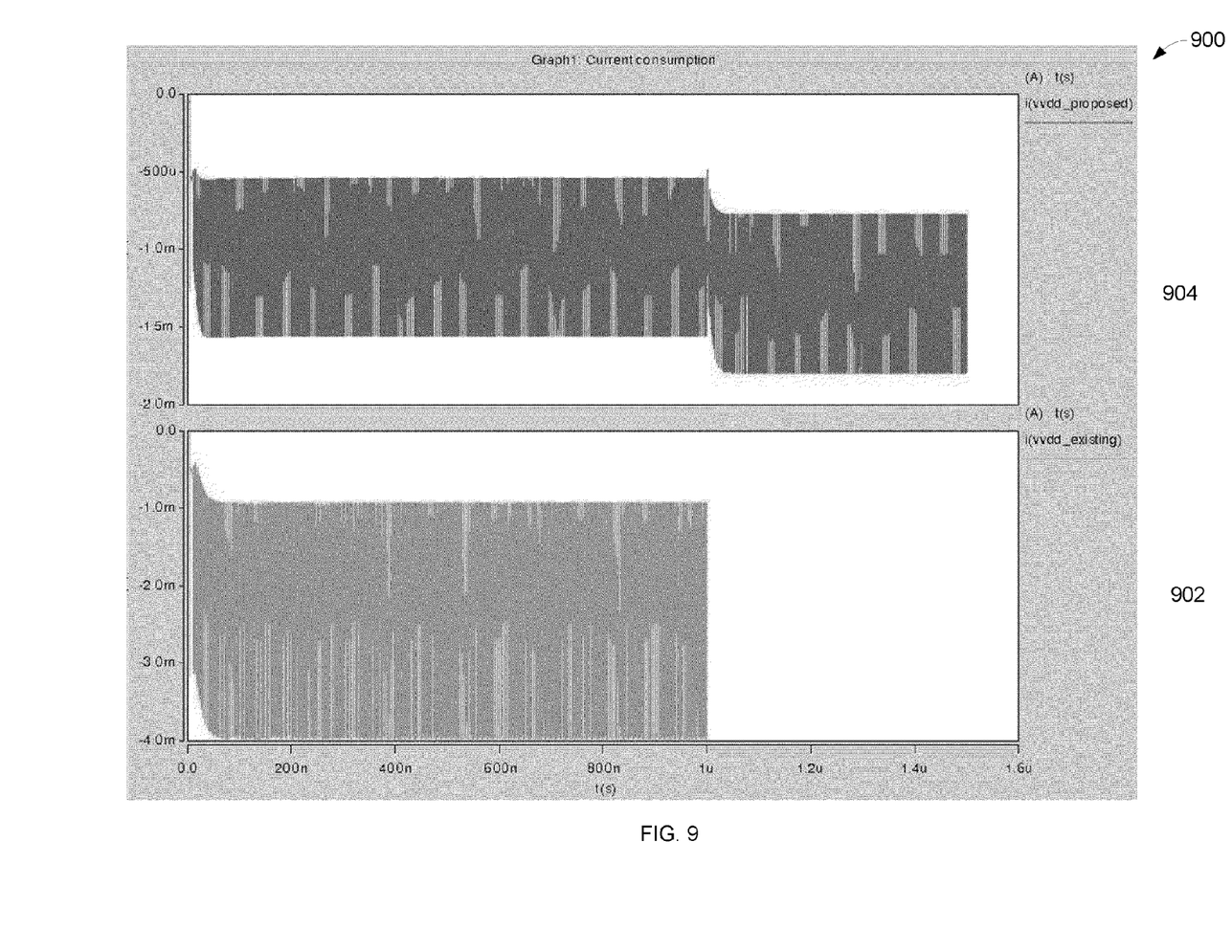
FIG. 9 illustrates simulation results for current consumption.

FIG. 9 illustrates, generally at 900, one embodiment of the invention 904 showing a simulation result for current consumption for an existing DCC design at 902 and for a DCC design using the techniques disclosed 904. The average current for an existing design 902 between time 600 ns-800 ns is 1,407.7 µA, while the average current for a DCC design using the techniques disclosed 904 between time 1.2 µs-1.4 µs is 1,133.0 µA, which represents a 19.5% reduction in current consumption.

Figure 10:
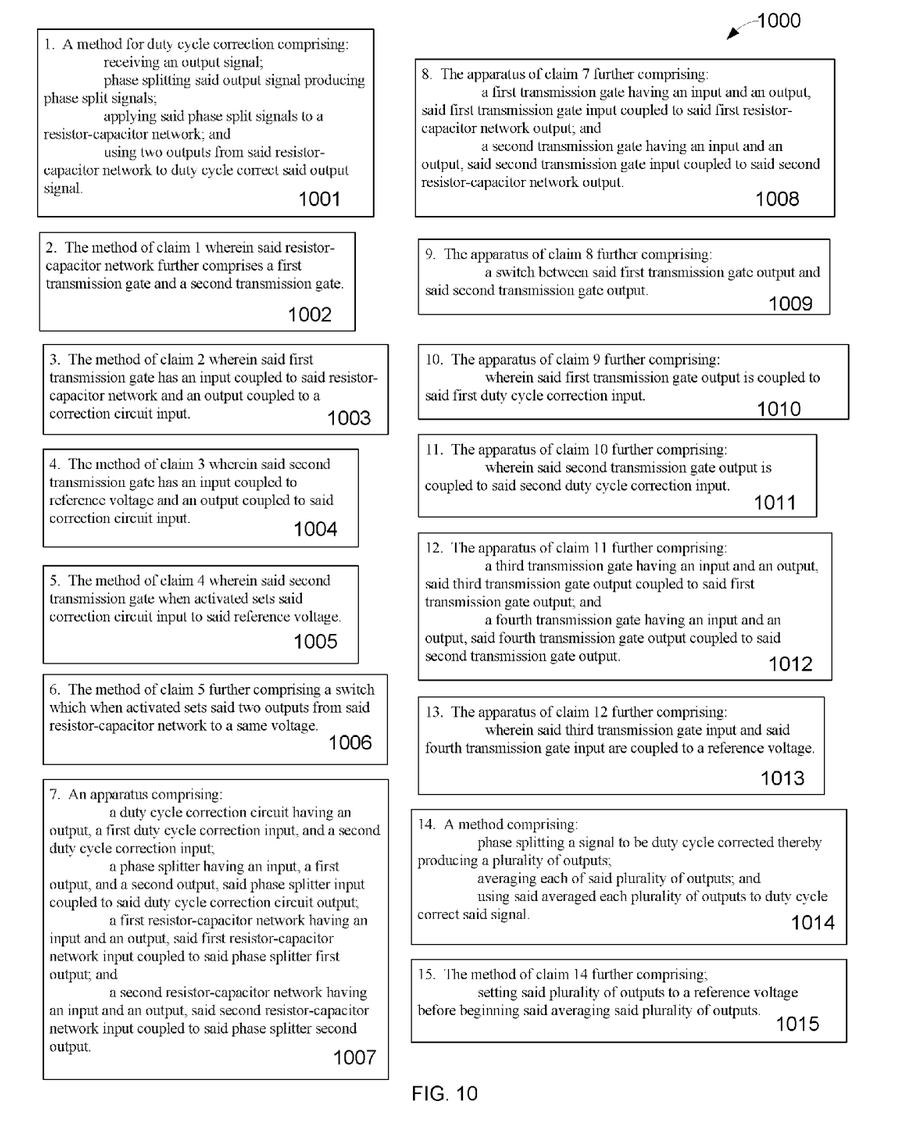
FIG. 10 illustrates various embodiments of the invention.

FIG. 10 illustrates, generally at 1000, embodiments of the invention.

At 1001 is 1. A method for duty cycle correction comprising: receiving an output signal;
phase splitting said output signal producing phase split signals;
applying said phase split signals to a resistor-capacitor network; and
using two outputs from said resistor-capacitor network to duty cycle correct said output signal.

At 1002 is 2. The method of claim 1 wherein said resistor-capacitor network further comprises a first transmission gate and a second transmission gate.

At 1003 is 3. The method of claim 2 wherein said first transmission gate has an input coupled to said resistor-capacitor network and an output coupled to a correction circuit input.

At 1004 is 4. The method of claim 3 wherein said second transmission gate has an input coupled to reference voltage and an output coupled to said correction circuit input.

At 1005 is 5. The method of claim 4 wherein said second transmission gate when activated sets said correction circuit input to said reference voltage.

At 1006 is 6. The method of claim 5 further comprising a switch which when activated sets said two outputs from said resistor-capacitor network to a same voltage.

At 1007 is 7. An apparatus comprising:
a duty cycle correction circuit having an output, a first duty cycle correction input, and a second duty cycle correction input;
a phase splitter having an input, a first output, and a second output, said phase splitter input coupled to said duty cycle correction circuit output;
a first resistor-capacitor network having an input and an output, said first resistor-capacitor network input coupled to said phase splitter first output; and
a second resistor-capacitor network having an input and an output, said second resistor-capacitor network input coupled to said phase splitter second output.

At 1008 is 8. The apparatus of claim 7 further comprising:
a first transmission gate having an input and an output, said first transmission gate input coupled to said first resistor-capacitor network output; and
a second transmission gate having an input and an output, said second transmission gate input coupled to said second resistor-capacitor network output.

At 1009 is 9. The apparatus of claim 8 further comprising:
a switch between said first transmission gate output and said second transmission gate output.

At 1010 is 10. The apparatus of claim 9 further comprising:
wherein said first transmission gate output is coupled to said first duty cycle correction input.

At 1011 is 11. The apparatus of claim 10 further comprising:
wherein said second transmission gate output is coupled to said second duty cycle correction input.

At 1012 is 12. The apparatus of claim 11 further comprising:
a third transmission gate having an input and an output, said third transmission gate output coupled to said first transmission gate output; and
a fourth transmission gate having an input and an output, said fourth transmission gate output coupled to said second transmission gate output.

At 1013 is 13. The apparatus of claim 12 further comprising:
wherein said third transmission gate input and said fourth transmission gate input are coupled to a reference voltage.

At 1014 is 14. A method comprising:
phase splitting a signal to be duty cycle corrected thereby producing a plurality of outputs;
averaging each of said plurality of outputs; and
using said averaged each plurality of outputs to duty cycle correct said signal.

At 1015 is 15. The method of claim 14 further comprising;
setting said plurality of outputs to a reference voltage before beginning said averaging said plurality of outputs.

Thus a method and apparatus for duty-cycle correction with reduced current consumption have been described.

Figure 1:
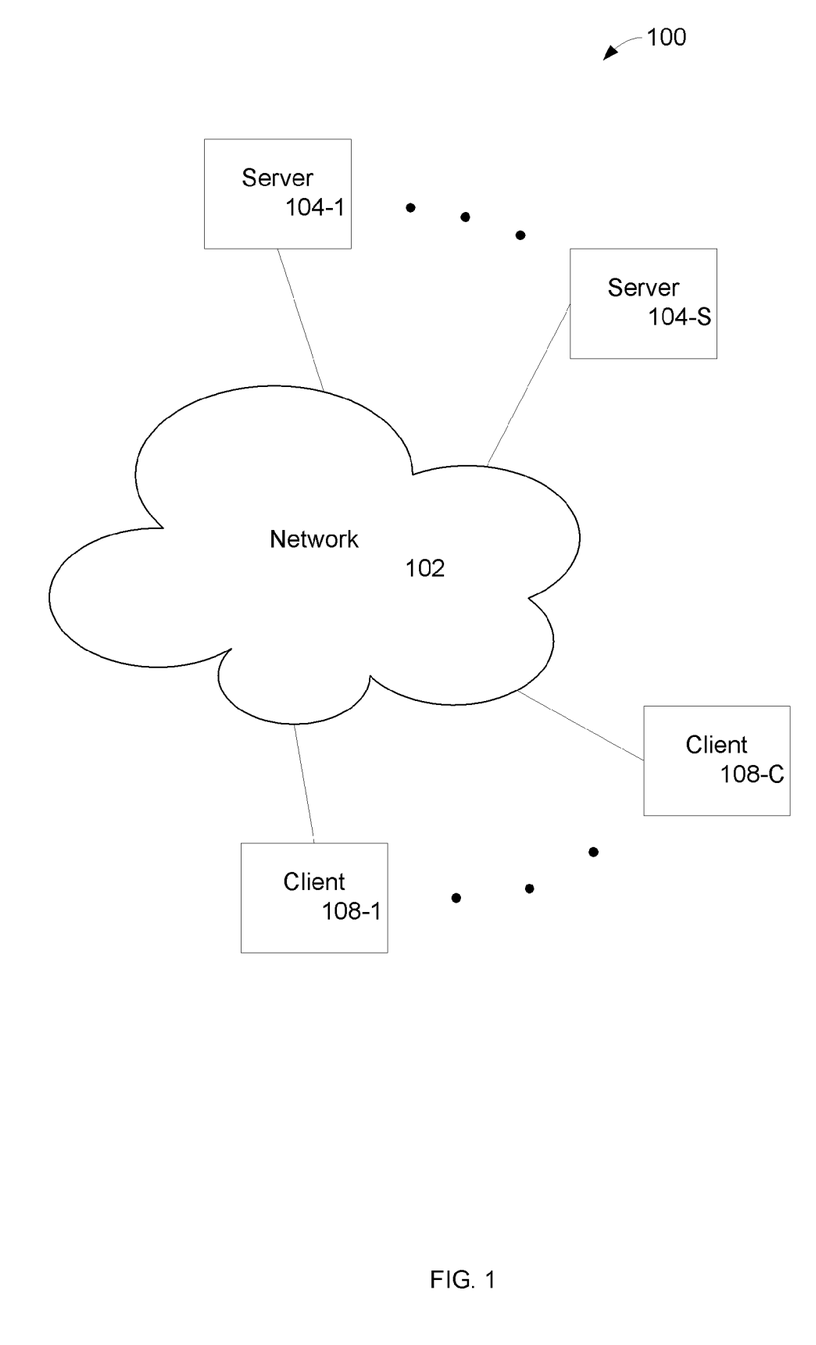
FIG. 1 illustrates a network environment in which the method and apparatus of the invention may be implemented.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
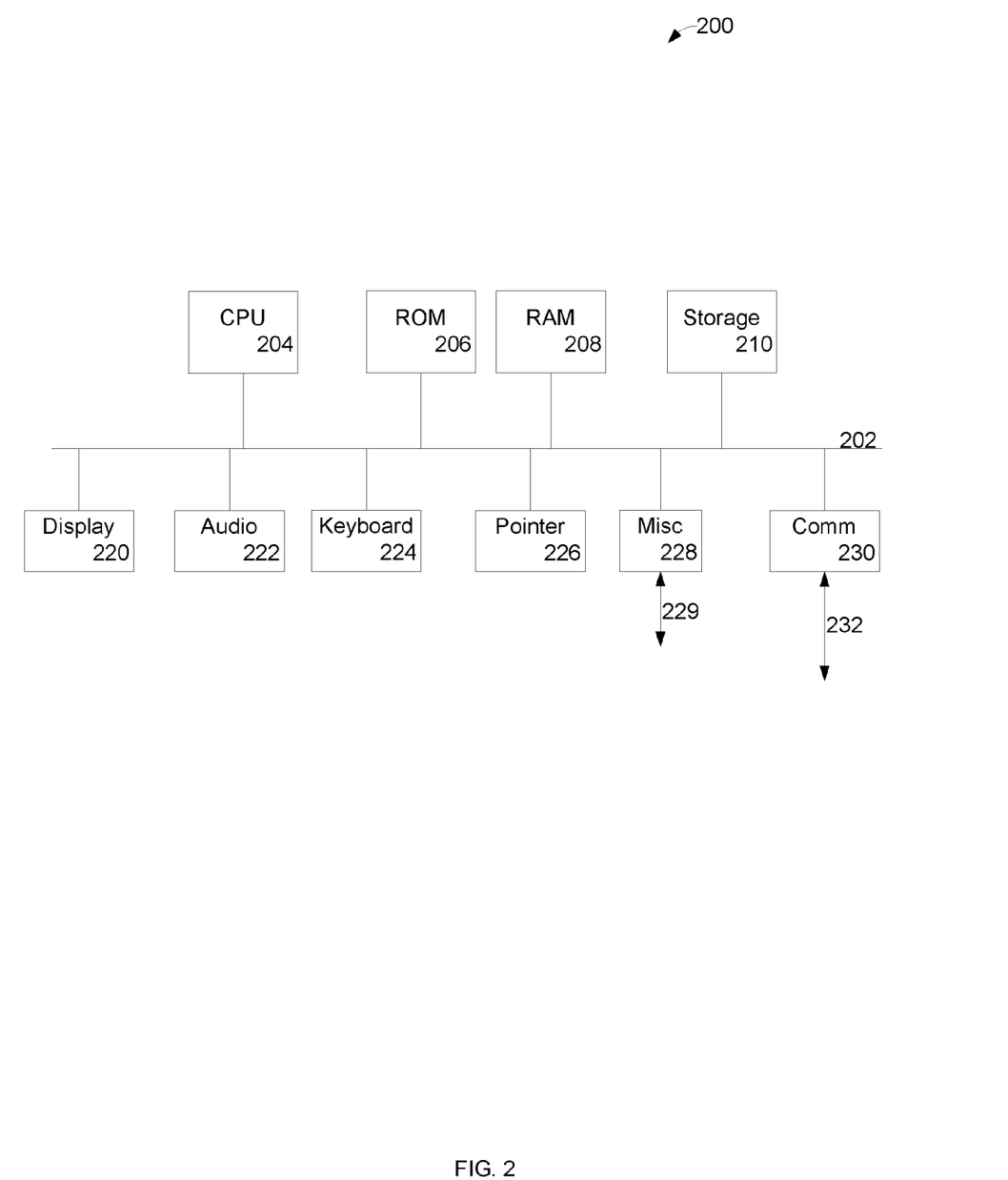
FIG. 2 is a block diagram of a computer system in which some embodiments of the invention may be used.

FIG. 2 is a block diagram of a computer system 200 in which some embodiments of the invention may be used and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be applied to essentially any type of visual communicating means or device whether local or remote, such as a LAN, a WAN, a system bus, etc. Thus, the invention may find application at both the S servers 104-1 through 104-S, and C clients 108-1 through 108-C.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228 via link 229, and communications 230 via link 232. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Display 220 might be, for example, an embodiment of the present invention. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals which upon reception causes movement in matter (e.g. electrons, atoms, etc.) (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

As used in this description, "substantially" or "substantially equal" or similar phrases are used to indicate that the items are very close or similar. Since two physical entities can never be exactly equal, a phrase such as ""substantially equal" is used to indicate that they are for all practical purposes equal.

It is to be understood that in any one or more embodiments of the invention where alternative approaches or techniques are discussed that any and all such combinations as my be possible are hereby disclosed. For example, if there are five techniques discussed that are all possible, then denoting each technique as follows: A, B, C, D, E, each technique may be either present or not present with every other technique, thus yielding 2^5 or 32 combinations, in binary order ranging from not A and not B and not C and not D and not E to A and B and C and D and E. Applicant(s) hereby claims all such possible combinations. Applicant(s) hereby submit that the foregoing combinations comply with applicable EP (European Patent) standards. No preference is given any combination.

Thus a method and apparatus for duty-cycle correction with reduced current consumption have been described.

What is claimed is:

1. A method for duty cycle correction comprising:
   receiving an output signal;
   phase splitting said output signal producing phase split signals;
   applying said phase split signals to a resistor-capacitor network; and
   using two outputs from said resistor-capacitor network to duty cycle correct said output signal.

2. The method of claim 1 wherein said resistor-capacitor network further comprises a first transmission gate and a second transmission gate.

3. The method of claim 2 wherein said first transmission gate has an input coupled to said resistor-capacitor network and an output coupled to a correction circuit input.

4. The method of claim 3 wherein said second transmission gate has an input coupled to reference voltage and an output coupled to said correction circuit input.

5. The method of claim 4 wherein said second transmission gate when activated sets said correction circuit input to said reference voltage.

6. The method of claim 5 further comprising a switch which when activated sets said two outputs from said resistor-capacitor network to a same voltage.

7. An apparatus comprising:
   a duty cycle correction circuit having an output, a first duty cycle correction input, and a second duty cycle correction input;
   a phase splitter having an input, a first output, and a second output, said phase splitter input coupled to said duty cycle correction circuit output;
   a first resistor-capacitor network having an input and an output, said first resistor-capacitor network input coupled to said phase splitter first output; and
   a second resistor-capacitor network having an input and an output, said second resistor-capacitor network input coupled to said phase splitter second output.

8. The apparatus of claim 7 further comprising:
   a first transmission gate having an input and an output, said first transmission gate input coupled to said first resistor-capacitor network output; and
   a second transmission gate having an input and an output, said second transmission gate input coupled to said second resistor-capacitor network output.

9. The apparatus of claim 8 further comprising:
   a switch between said first transmission gate output and said second transmission gate output.

10. The apparatus of claim 9 further comprising:
    wherein said first transmission gate output is coupled to said first duty cycle correction input.

11. The apparatus of claim 10 further comprising:
    wherein said second transmission gate output is coupled to said second duty cycle correction input.

12. The apparatus of claim 11 further comprising:
    a third transmission gate having an input and an output, said third transmission gate output coupled to said first transmission gate output; and
    a fourth transmission gate having an input and an output, said fourth transmission gate output coupled to said second transmission gate output.

13. The apparatus of claim 12 further comprising:
    wherein said third transmission gate input and said fourth transmission gate input are coupled to a reference voltage.

14. A method comprising;
    phase splitting a signal to be duty cycle corrected thereby producing a plurality of outputs;
    averaging each of said plurality of outputs;
    using said averaged each plurality of outputs to duty cycle correct said signal; and setting said plurality of outputs to a reference voltage before beginning said averaging said plurality of outputs.

* * * * *